(12) United States Patent
McVay

(10) Patent No.: US 10,803,921 B2
(45) Date of Patent: Oct. 13, 2020

(54) TEMPERATURE MANAGEMENT IN OPEN-CHANNEL MEMORY DEVICES

(71) Applicant: Intel Corporation, Santa Clara, CA (US)

(72) Inventor: Jeffrey L. McVay, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 110 days.

(21) Appl. No.: 16/116,732

(22) Filed: Aug. 29, 2018

(65) Prior Publication Data

US 2019/0043559 A1 Feb. 7, 2019

(51) Int. Cl.
*G06F 1/20* (2006.01)
*G11C 11/406* (2006.01)
*G11C 16/26* (2006.01)
*G11C 16/34* (2006.01)
*G06F 1/3234* (2019.01)
*G06F 1/3287* (2019.01)
(Continued)

(52) U.S. Cl.
CPC ........ *G11C 11/40626* (2013.01); *G06F 1/206* (2013.01); *G06F 1/3275* (2013.01); *G06F 1/3287* (2013.01); *G06F 3/0634* (2013.01); *G11C 16/26* (2013.01); *G11C 16/34* (2013.01); *G11C 7/04* (2013.01)

(58) Field of Classification Search
CPC ...... G06F 1/206; G06F 3/0625; G06F 3/0653; G06F 3/0679; G06F 3/0634
See application file for complete search history.

(56) References Cited

U.S. PATENT DOCUMENTS 8,786,449 B1* 7/2014 Kraipak .................. G06F 1/206
340/584
2014/0101371 A1* 4/2014 Nguyen ................ G06F 3/0634
711/103
(Continued)

OTHER PUBLICATIONS

Sivashankar, and S. Ramasamy. "Design and Implementation of Non-Volatile Memory Express." 2014 International Conference on Recent Trends in Information Technology, 2014. (Year: 2014).*

(Continued)

*Primary Examiner* — Jay W. Radke
(74) *Attorney, Agent, or Firm* — Schwabe, Williamson & Wyatt, P.C.

(57) ABSTRACT

Embodiments of the present disclosure are directed towards apparatuses and methods for temperature management of a non-volatile memory device, e.g., an open-channel solid state device (OCSSD). In embodiments, an apparatus includes a temperature manager operatively coupled to the processor to submit a request for a temperature of an individual die of a memory device and based at least in part on a response to the request that includes the received temperature of the individual die, control access to the individual die by selectively restricting access to the individual die, while permitting access to another individual die on the memory device. In embodiments, the request is submitted via an input/output (I/O) path or I/O queue and includes a physical address of the individual memory die. Additional embodiments may be described and claimed.

19 Claims, 7 Drawing Sheets

(51) Int. Cl.
*G06F 3/06* (2006.01)
*G11C 7/04* (2006.01)

(56) References Cited

U.S. PATENT DOCUMENTS

| | | | | |
|---|---|---|---|---|
| 2015/0379408 | A1* | 12/2015 | Kapoor | G01W 1/10 |
| | | | | 706/46 |
| 2016/0162219 | A1* | 6/2016 | Erez | G06F 3/0653 |
| | | | | 711/103 |
| 2016/0306592 | A1* | 10/2016 | Oh | G06F 3/0653 |
| 2017/0003889 | A1* | 1/2017 | Kim | G06F 3/0611 |
| 2019/0004723 | A1* | 1/2019 | Li | G06F 3/0634 |
| 2019/0050153 | A1* | 2/2019 | Yang | G11C 11/5642 |

OTHER PUBLICATIONS

Open-Channel Solid State Drives Specification, Revision 2.0, Jan. 29, 2018 (Year: 2018).*

* cited by examiner

TEMPERATURE MANAGEMENT IN OPEN-CHANNEL MEMORY DEVICES

FIELD

Embodiments of the present disclosure generally relate to the field of integrated circuits (IC), and more particularly, to temperature management of non-volatile memory (NVM) devices.

BACKGROUND

In open-channel solid state devices (OCSSDs), in contrast to traditional solid state devices (SSDs), the internal parallel organization of access to the memory dies is exposed and managed directly by the host device. For example, the Open-channel Solid State Drive Specification calls for the host device to have exclusive and direct physical access to the non-volatile memory (NVM) on the device. As provided by the Specification, the host device can utilize an OCSSD's internal parallelism by dividing the device into its parallel unit boundaries. The read and write operations are directed by the host device, which is also responsible for the logical to physical (L2P) mapping.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
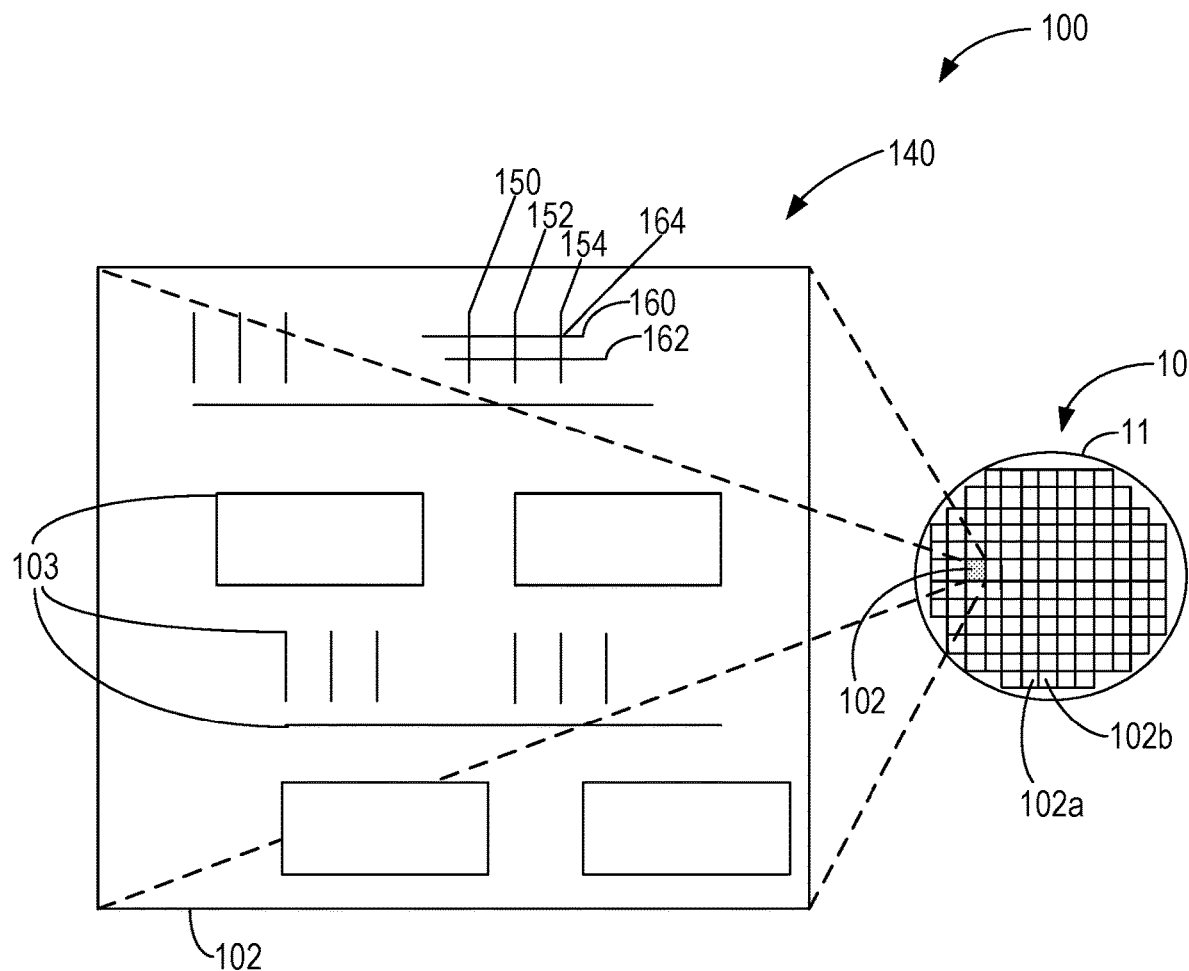
FIG. 1 illustrates an example die in which a memory device may be provided, in accordance with embodiments of the present disclosure.

Embodiments described include methods, apparatuses, and systems including a temperature manager operatively coupled to a processor to request a temperature of an individual die of a memory device and based at least in part on a response to the request, control access to the individual die by selectively restricting access to the individual die while permitting access to another individual die on the memory device. In embodiments, the memory device includes a physically addressable solid state memory device, such as, e.g., an open-channel solid state device (OCSSD).

In embodiments, the request includes a physical address of the individual die and is submitted via an input/output path such as, e.g., an (I/O) submission queue, including commands directed to the individual die.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

One of the features of a physically addressable solid state memory device, such as, e.g., an open-channel solid state device (OCSSD), is workload isolation. For example, a host device may assign clients to specific subsets of memory die on the OCSSD that are isolated from specific subsets of memory die assigned to other clients. Thus, an OCSSD can support a write intensive workload to particular physical subsets of memory die on a memory device while minimizing its impact on read heavy clients that may share the memory device. Isolating write workloads to specific physical subsets of memory die, however, often leads to localized heating that can escape a thermal sensor embedded in a memory controller or memory device. In order to better manage thermal conditions internal to a memory device such as an OCSSD or other physically addressable solid state device, the host device needs a method to query sensors on an individual non-volatile memory die, rather than an entire subset of memory dies.

FIG. 1 illustrates an example die in which a memory device may be provided using the techniques of the present disclosure, in accordance with some embodiments. More specifically, FIG. 1 schematically illustrates an integrated circuit assembly (IC) assembly 100 including a top view of die 102 in wafer form 10 and in singulated form 140, in accordance with some embodiments. In some embodiments, the die 102 may be one of a plurality of dies (e.g., die 102, 102a, 102b) of a wafer 11 composed of semiconductor material such as, for example, silicon or other suitable material. The plurality of dies may be formed on a surface of the wafer 11. Each of the dies may be a repeating unit of a semiconductor product that may include a memory device. For example, die 102 may include circuitry 103 and/or another memory device module or component as described herein to request a temperature of an individual die of a memory device and based at least in part on a response to the request, control access to the individual die by selectively restricting access to the individual die while permitting access to another individual die on the memory device, as described herein in accordance with some embodiments. According to various embodiments, the circuitry 103 may include one or more memory elements (memory cells, such as, e.g., multi-level per cell memory cells), which may be configured in an array, such as a two-dimensional (2D) or three-dimensional (3D) non-volatile multi-level cell (MLC) memory array. In some embodiments, the memory array may comprise a 3D multi-level per cell such as three-level-per-cell (TLC) or four-level-per-cell (QLC) NAND memory array. In some embodiments, the memory array comprises a cross-point MLC memory array.

The circuitry 103 may further include one or more wordline(s) (also referred to as "WL" or "WLs") (e.g., 150, 152, 154) and one or more bitline(s) (also referred to as "BL" or "BLs") (e.g., 160, 162) coupled to the memory elements. Only three wordlines and two bitlines are shown in FIG. 1 for ease of understanding. In some embodiments, the bitlines and wordlines may be configured such that each of the memory elements may be disposed at an intersection (e.g., 164) of each individual bitline and wordline (e.g., 160 and 154), in a cross-point configuration. A voltage or bias can be applied to a target memory element of the memory elements using the wordlines and the bitlines to select the target memory cell for a read or write operation. Bitline drivers may be coupled to the bitlines and wordline drivers may be coupled to the wordlines to facilitate decoding/selection of the memory elements. To enable memory cell selection, the wordlines 150, 152, 154 may be connected with memory cells and other parts of circuitry 103 via interconnects, including respective contact structures (e.g., vias) that provide electrical connectivity through the layers of the die 102 as described below in greater detail. It is noted that the circuitry 103 is only schematically depicted in FIG. 1 and may represent a wide variety of suitable logic or memory in the form of circuitry or other suitable devices and configurations including, for example, one or more state machines including circuitry and/or instructions in storage (e.g., firmware or software) configured to perform actions such as read, program, verify and/or analysis operations in connection with a read operation time adjustment as described herein.

In some embodiments, circuitry 103 may be formed using suitable semiconductor fabrication techniques, some of which are described herein. After a fabrication process of the semiconductor product is complete, the wafer 11 may undergo a singulation process in which each of the dies (e.g., die 102) may be separated from one another to provide discrete "chips" of the semiconductor product. The wafer 11 may be any of a variety of sizes. According to various embodiments, the circuitry 103 may be disposed on a semiconductor substrate in wafer form 10 or singulated form 140. In some embodiments, the die 102 may include logic or memory, or combinations thereof.

Figure 2:
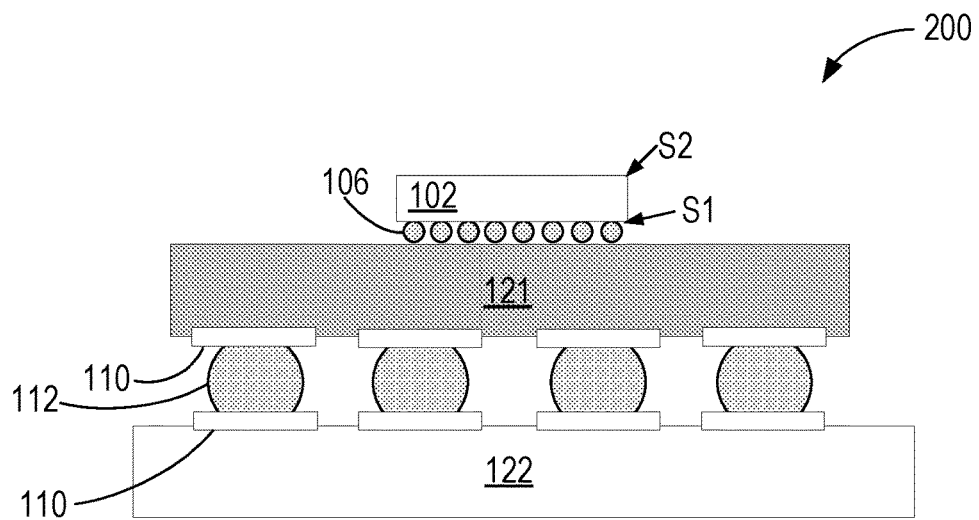
FIG. 2 schematically illustrates a cross-section side view of an integrated circuit (IC) assembly that may include a memory device, in accordance with embodiments of the present disclosure.

FIG. 2 schematically illustrates a cross-section side view of an integrated circuit (IC) assembly 200 that may include a memory device provided in accordance with some embodiments described herein. In some embodiments, the IC assembly 200 may include one or more dies electrically and/or physically coupled with a package substrate 121. The die 102 may include circuitry (e.g., circuitry 103 of FIG. 1) and/or other suitable components or modules to perform operations in connection with temperature management of a memory device as described herein. In some embodiments, the package substrate 121 is coupled with a circuit board 122, as shown.

The IC assembly 200 may include a wide variety of configurations including, for example, suitable combinations of flip-chip and/or wire-bonding configurations, interposers, multi-chip package configurations including System in Package (SiP) and/or Package on Package (PoP) configurations. For example, the die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include circuitry such as, for example, memory elements as described in reference to FIG. 1. An inactive side, S2, may be disposed opposite to the active side S1, as can be seen. In other embodiments, the die 102 may be disposed on another die that is coupled with the package substrate 121 in any of a variety of suitable stacked die configurations. For example, a processor die may be coupled with the package substrate 121 in a flip-chip configuration and the die 102 may be mounted on the processor die in a flip-chip configuration and electrically coupled with the package substrate 121 using through-silicon vias (TSVs) formed through the processor die. In still other embodiments, the die 102 may be embedded in the package substrate 121 or coupled with a die that is embedded in the package substrate 121. Other dies may be coupled with the package substrate 121 in a side-by-side configuration with the die 102 in other embodiments.

In some embodiments, the die-level interconnect structures 106 may be configured to route electrical signals between the die 102 and the package substrate 121. The electrical signals may include, for example, input/output (I/O) signals and/or power/ground signals that are used in connection with operation of the die. The die-level interconnect structures 106 may be coupled with corresponding die contacts disposed on the active side S1 of the die 102 and corresponding package contacts disposed on the package substrate 121. The die contacts and/or package contacts may include, for example, pads, vias, trenches, traces and/or other suitable contact structures, fabrication of some of which is described below.

In some embodiments, the package substrate 121 may comprise an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, package contacts (e.g., pads 110) disposed on one or more surfaces of the package substrate 121 and/or internal routing features (not shown) such as, for example, trenches, vias or other interconnect structures to route electrical signals through the package substrate 121.

In some embodiments, the package substrate 121 may be coupled with a circuit board 122, as can be seen. The circuit board 122 may be a printed circuit board (PCB) composed of an electrically insulative material such as an epoxy laminate. For example, the circuit board 122 may include electrically insulating layers composed of materials that may be laminated together. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 may be a motherboard and may be included in a computing device, such as, for example, a mobile device.

Package-level interconnects such as, for example, solder balls 112 may be coupled to pads 110 on the package substrate 121 and/or on the circuit board 122 to form corresponding solder joints that may be configured to further route the electrical signals between the package substrate 121 and the circuit board 122. The pads 110 may be composed of any suitable electrically conductive material such as metal. The package-level interconnect may include other structures and/or configurations including, for example, land-grid array (LGA) structures and the like. In embodiments, the die 102 of the IC assembly 200 may be, include, or be a part of an IC including a memory device, such as, e.g., a physically addressable solid state memory device as described herein.

Figure 3:
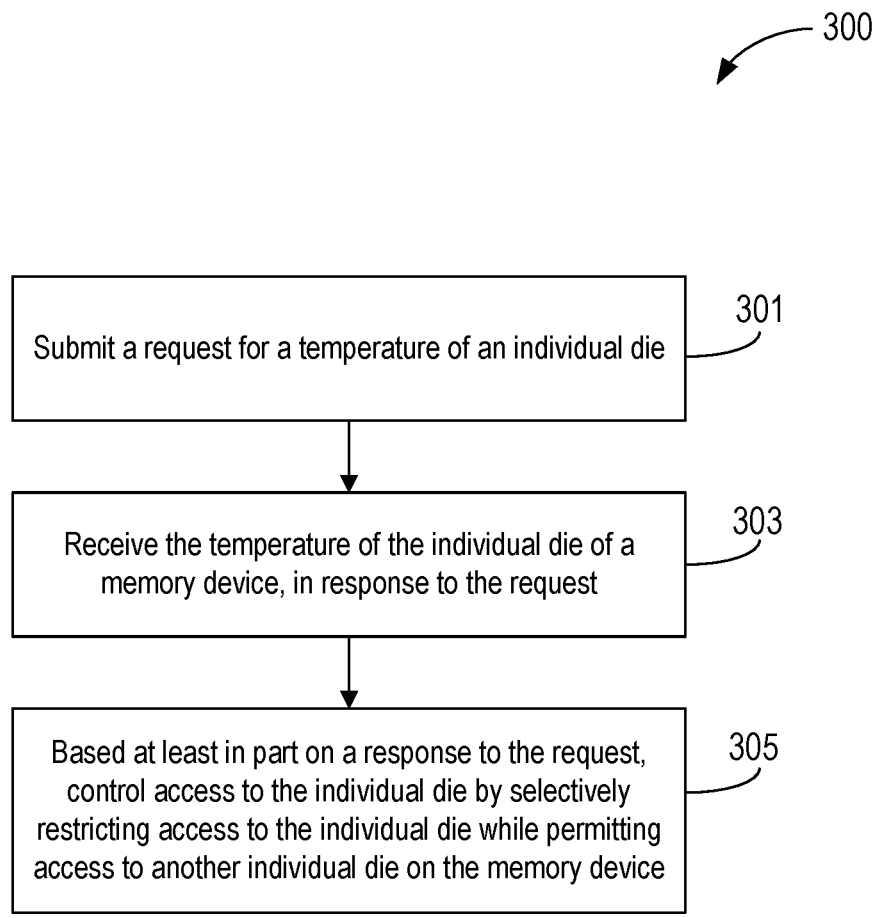
FIGS. 3 and 4 are flow diagrams illustrating respective example processes, in accordance with embodiments of the present disclosure.

FIG. 3 is a flow diagram illustrating an example process 300 that is performed by, e.g., a host device, or a processor or host processor of the host device (hereinafter "host device"), in accordance with embodiments of the present disclosure. In an embodiment, beginning at a block 301, a host device may submit a request for a temperature of an individual die included in a plurality of individual die on a memory device. In embodiments, the host device includes a temperature manager to submit the request via an input/output path, e.g., via an I/O submission queue. In embodiments, the I/O submission queue includes one or more additional commands directed to the individual die in a physically addressable solid state memory device. In embodiments, the individual die is included in a first parallel unit (PU) of the memory device and shares a transfer bus with another individual die included in a second parallel unit (PU) of the physically addressable solid state memory device (discussed and shown further in connection with FIG. 5). In embodiments, the request by the temperature manager for the temperature of the individual die includes a physical address of the individual die.

Next, at block 303, the host device, in response to the request, receives the temperature of the individual die of the memory device. At block 305, in embodiments, based at least in part on the response to the request, the temperature manager of the host device controls access to the individual die by selectively restricting access to the individual die while permitting access to another individual die on the memory device. Accordingly, in embodiments, the temperature manager controls access to the individual die of the memory device by selectively throttling or stalling commands directed to the individual die, depending on a temperature of the individual die. In embodiments, to control access by the temperature manager to the individual die in the first parallel unit (PU) comprises to control access independently of controlling access to another individual die in the second parallel unit (PU).

Figure 4:
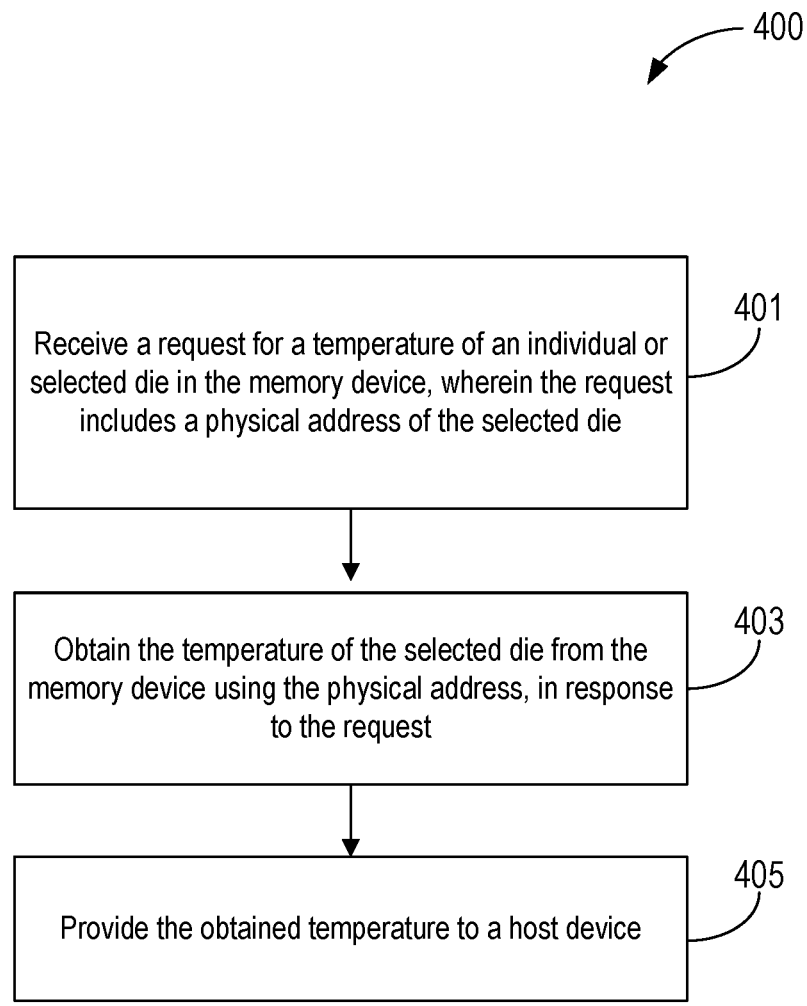

FIG. 4 is a flow diagram illustrating an example process 400 that is performed by, e.g., a memory controller, in response to a request by a host device for a temperature of an individual die, according to embodiments of the disclosure. In an embodiment, beginning at a block 401, a temperature data transfer module operable by the memory controller receives a request for a temperature of the individual or selected die in the memory device. In embodiments, the request is from a host device, e.g., as described in connection with FIG. 3, and includes a physical address of the selected die. At a next block 403, the memory controller obtains the temperature of the selected die from the memory device using the physical address. At block 405, in the embodiment, the memory controller provides the obtained temperature to the host device in response to the request.

Figure 5:
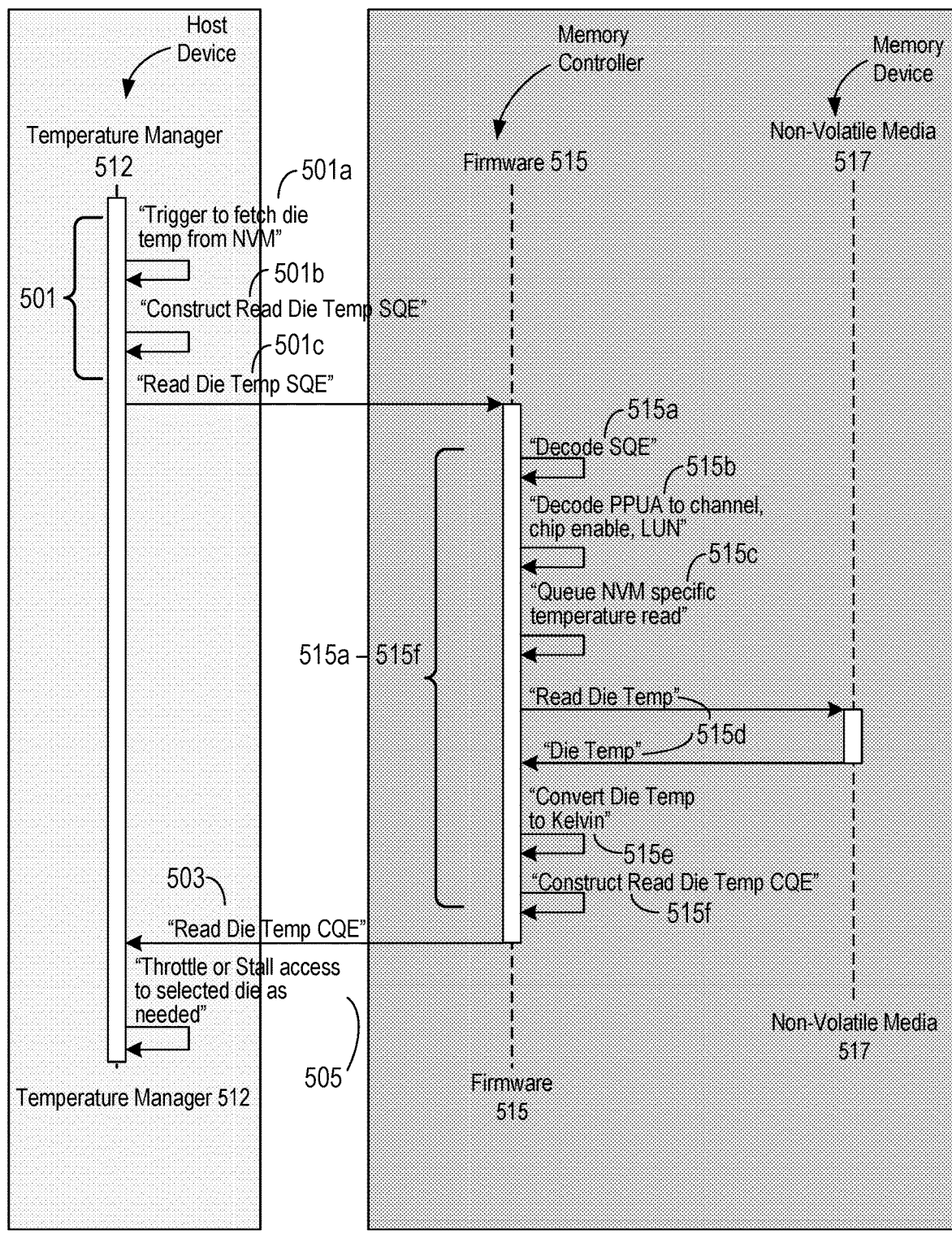
FIG. 5 is a sequence diagram illustrating embodiments associated with the flow diagrams of FIGS. 3 and 4, in accordance with embodiments of the present disclosure.

FIG. 5 is a sequence diagram 500 illustrating embodiments associated with FIGS. 3 and 4. As shown, in FIG. 5, a host device includes a temperature manager 512 to manage a memory device, e.g., a non-volatile memory (NVM) device or non-volatile media 517, via a memory controller including a temperature data transfer module, e.g., firmware 515. In FIG. 5, in embodiments, temperature manager 512 submits a request for a temperature of an individual die at 501. In embodiments, the request includes a command submitted to firmware 515 via an input/output (I/O) submission queue (further shown in FIG. 6). In various embodiments, the I/O submission queue includes read, write, and reset commands directed to the individual die. Accordingly, in some embodiments, the request is inserted between read, write, and erase commands that are directed to, or target, the individual or selected die. Accordingly, in embodiments, at 501a, a trigger to fetch the temperature of the individual die directs temperature manager 512 to construct a "Read Die Temp" submission queue entry ("SQE"). In response, temperature manager 512 constructs the "Read Die Temp" SQE at 501b. In embodiments, temperature manager 512 then submits the SQE via the I/O submission queue at 501c.

In embodiments, at 515a-515f, firmware 515 receives the SQE and subsequently obtains the temperature of the individual die from non-volatile media 517 using a physical address included in the request. Accordingly for the embodiment, firmware 515 decodes the SQE at 515a. In embodiments, non-volatile media 517 is a physically addressable solid state memory device that includes an open-channel solid state memory device. In embodiments, an individual die corresponding to a logical unit number (LUN) is included in a first parallel unit (PU) of, e.g., the open-channel solid state memory device. In embodiments, at 515*b* firmware 515 decodes a physical parallel unit address (PPUA) to a specific channel and IC chip on non-volatile media 517 that includes the individual die or LUN. Once the physical address is decoded, firmware 515 queues a command for a specific temperature read of the individual die at 515*c*. In embodiments, the temperature data transfer module or firmware 515 then obtains the temperature of the individual or selected die from an individual temperature sensor of the selected die at 515*d* via, e.g., a "Read Die Temp" command and a corresponding "Die Temp" response. In some embodiments, at 515*e*, firmware 515 converts the die temperature received from the individual temperature sensor of the selected die from Celsius to Kelvin. At 515*f*, in embodiments, the firmware constructs a completion queue entry (CQE) including the temperature of the individual die, in, e.g., Kelvin, for submission to the host device.

Accordingly, in the Example of FIG. 5, the CQE including the die temperature is then submitted at 503 to the host device. In embodiments, once received, based at least in part on the temperature of the individual die, the host device controls access to the individual die by selectively throttling or stalling commands directed to the individual or selected die at 505.

Note that FIG. 5 is only one example of a sequence and its associated commands that is used by a host device and a memory controller to perform functions as described above. In some alternative implementations, the functions in the sequence may be combined or occur out of the order noted in FIG. 5.

Figure 6:
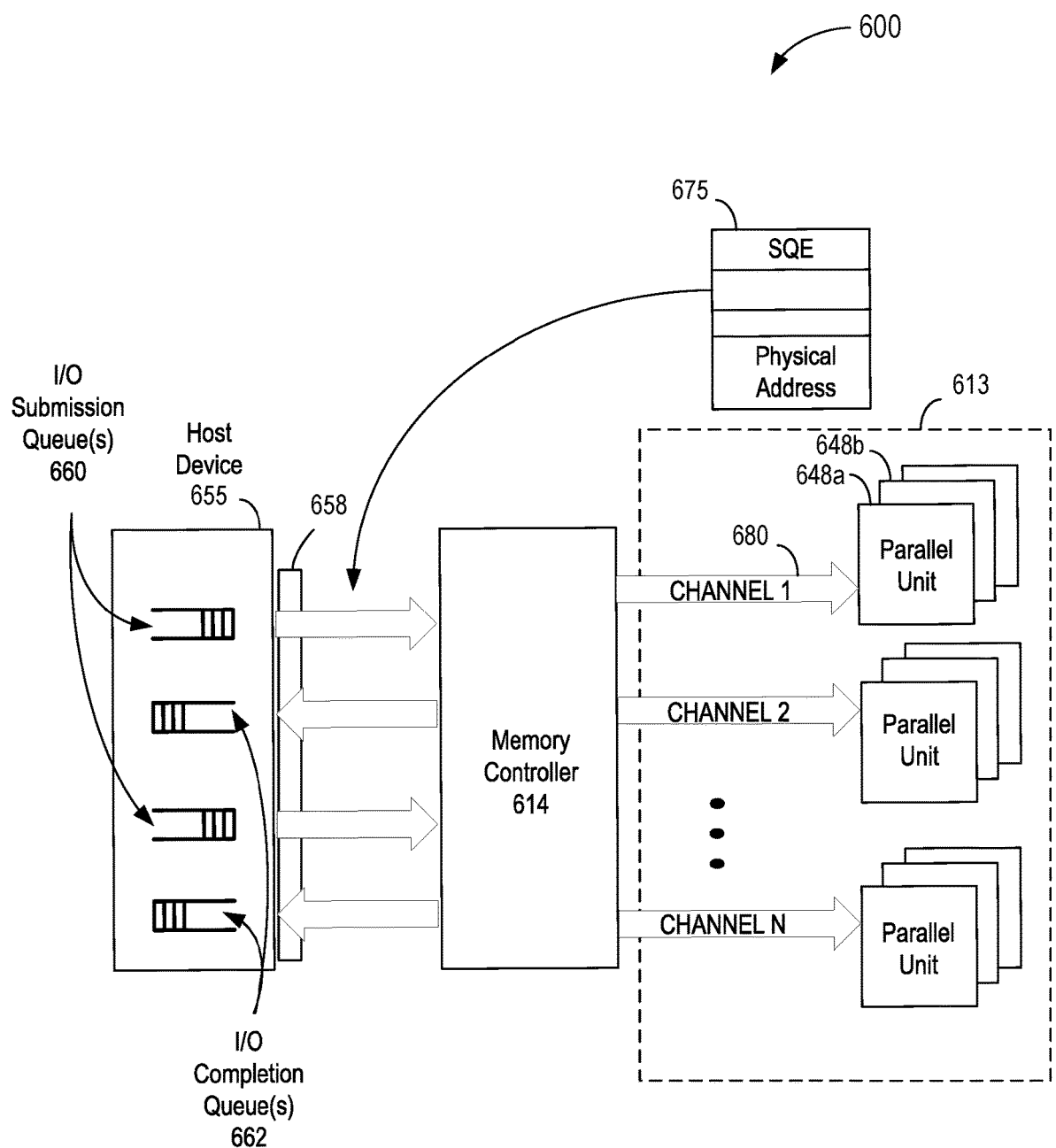
FIG. 6 is a block diagram associated with embodiments of FIGS. 3-5, in accordance with embodiments of the present disclosure.

Referring now to FIG. 6, which is a block diagram 600 associated with the embodiments of FIGS. 3-5, in accordance with embodiments of the present disclosure. FIG. 6 illustrates a host device 655 including one or more port(s) 658 coupled to a memory controller 614. In embodiments, host device 655 includes example I/O submission queue(s) 660 and I/O completion queue(s) 662. In embodiments, port(s) 658 is one or more PCI Express (PCI-e), serial advanced technology attachment (SATA), serial attached small computer system interface (SAS) or other suitable bus interface to which a temperature manager coupled to the port and operatively coupled to a processor is to, via port(s) 658, submit, e.g., a submission queue entry, e.g., SQE 675.

In embodiments and as discussed in connection with FIG. 5, SQE 675 includes a physical address of a selected or individual die. In embodiments, SQE 675 is a submission queue entry that complies with the Non-Volatile Memory Host Controller Interface Specification or Non-Volatile Memory (NVM) Express transfer protocol. Note that in other embodiments, various commands or queue entries (e.g., SQE 675 or corresponding CQE (not shown)) may comply with other suitable transfer protocols for requesting and providing a temperature of an individual die via an I/O path to and from a respective host device and memory controller. In various embodiments, I/O submission queue(s) 660 include read, write, and reset commands directed to an individual die. Accordingly, in embodiments, the request takes advantage of efficiencies by its insertion of an associated command between read, write, and erase commands that are directed to, or target, the individual or selected die.

As illustrated, memory controller 614 is coupled to a memory device 613, e.g., an OCSSD, and an individual die is included in a first parallel unit (PU) 648*a* of the memory device 613. In embodiments, another individual die in a second PU 648*b* may share a channel 680 with the selected or individual die. In embodiments, a first and a second individual die that are located in first PU and a second PU sharing a same channel accordingly share a same transfer bus in memory device 613. In embodiments, a temperature manager of host device 655 is able to controls access to the individual die in PU 648*a* independently of controlling access to the another individual die in the second PU 648*b*.

Figure 7:
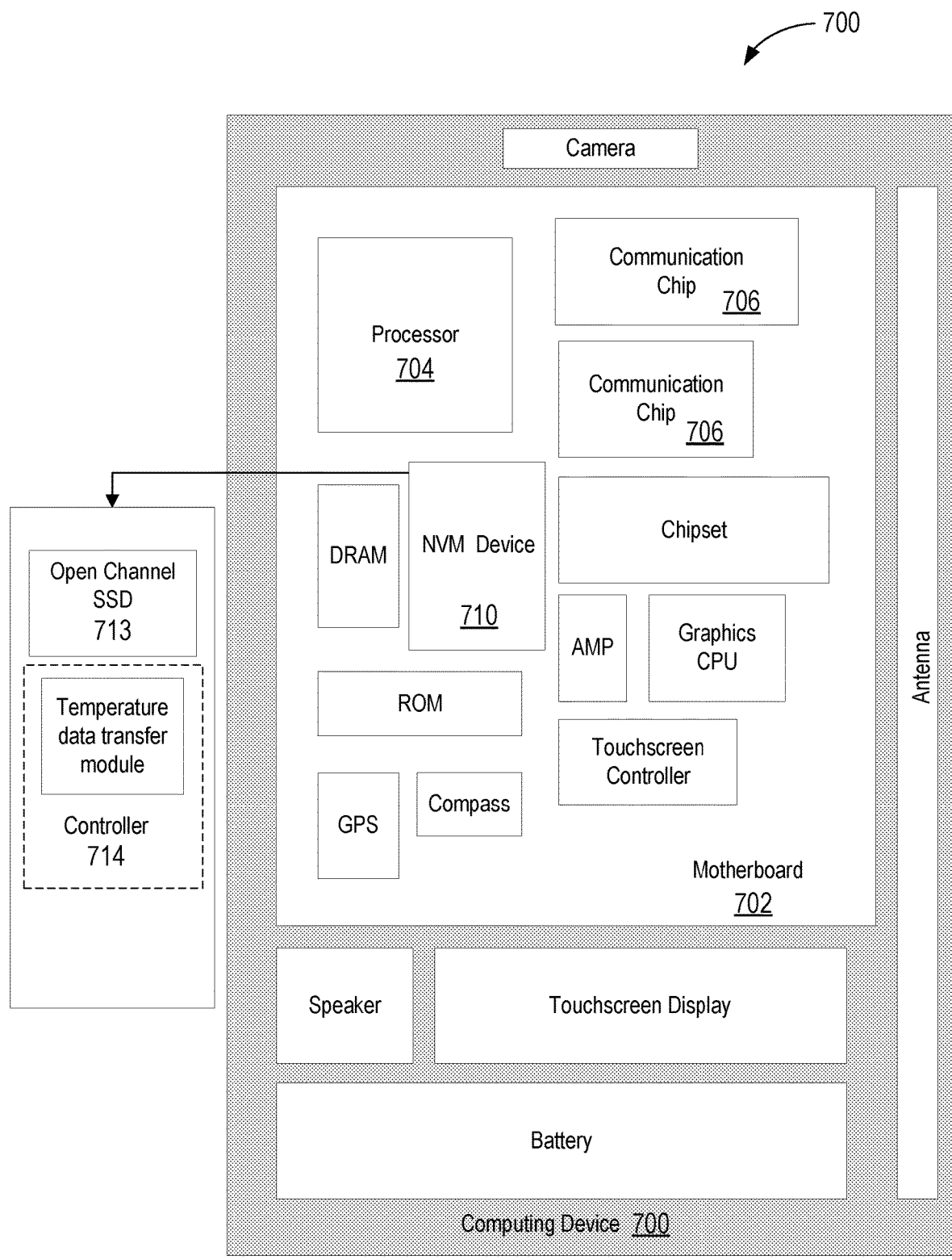
FIG. 7 a schematic of a computing system, in accordance with embodiments of the present disclosure.

FIG. 7 illustrates a computing system including a computing device 700 that includes a memory device (e.g., a non-volatile memory device (NVM) 710) in accordance with various embodiments of the present disclosure. In embodiments, computing device 700 houses a board 702, such as, for example, a motherboard. The board 702 may include a number of components, including but not limited to a processor 704 and at least one communication chip 706. The processor 704 is physically and electrically coupled to the board 702. In some implementations, the at least one communication chip 706 is also physically and electrically coupled to the board 702. In further implementations, the communication chip 706 is part of the processor 704. Accordingly, in some embodiments, a processor or host processor, e.g., processor 704 couples to a memory device, e.g., NVM 710, wherein the memory device includes an individual die included in a plurality of individual die on the memory device; and a temperature manager operatively coupled to the processor to perform a process, e.g., as described in connection with process 300 of FIG. 3.

The NVM 710 may be packaged in an IC assembly (e.g., IC assembly 100 of FIG. 1) that includes the NVM 710 that receives a request for a temperature of a selected or individual memory die and obtains a temperature of the individual or selected memory die as described herein in accordance with some embodiments.

Accordingly, in some embodiments, NVM memory device 710 includes a physically addressable solid state memory device (SSD) and includes, e.g., an open-channel solid state device (OCSSD) 713, coupled to a controller 714. In some embodiments, OCSSD 713 is a NAND flash memory device. In some embodiments, OCSSD 713 includes a 3D XPOINT™ memory device and controller 714 includes a 3D XPOINT™ memory controller. As shown, controller 714 is to perform operations in connection with embodiments described in FIGS. 4-5. Accordingly, in embodiments, controller 714 receives a request for a temperature of a selected or individual die in the physically addressable SSD via an input/output path, wherein the request includes a physical address of the selected die, obtains the temperature of the selected die from the memory device using the physical address in response to the request, and provides the obtained temperature to a host device in response to the request. In embodiments, the temperature is to be used by a host device (e.g., computing device 700) to control access to the individual die, including to restrict access to the individual die while permitting access to another individual die on the memory device, e.g., OCSSD 713.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die, e.g., die described in connection with the above embodiments, packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Accordingly, in embodiments, computing device 700 includes a memory device, e.g., NVM memory device 710, and a memory controller (e.g., controller 714), coupled to the memory device as well as a temperature data transfer module operable by the memory controller to receive a request for a temperature of a selected die in the memory device via an I/O path. In embodiments, the request includes a physical address of the selected die. In embodiments, the temperature data transfer module obtains the temperature of the selected die using the physical address in response to the request and provides the obtained temperature to a host device in response to the request. In embodiments, the temperature is to be used by the host device to control access to an individual die, where to control access includes to restrict access to the individual die while permitting access to another individual die on the memory device. In embodiments, the temperature data transfer module includes firmware (e.g., firmware 515 of FIG. 5) and decodes the physical address and locate the selected die on a shared channel of the memory device and wherein the shared channel is shared by the another individual die on the memory device. In embodiments, the temperature data transfer module provides the obtained temperature in response to the request via a completion queue entry submitted to the host device and obtains the temperature of the selected die from an individual temperature sensor of the selected die on the memory device.

Figure 8:
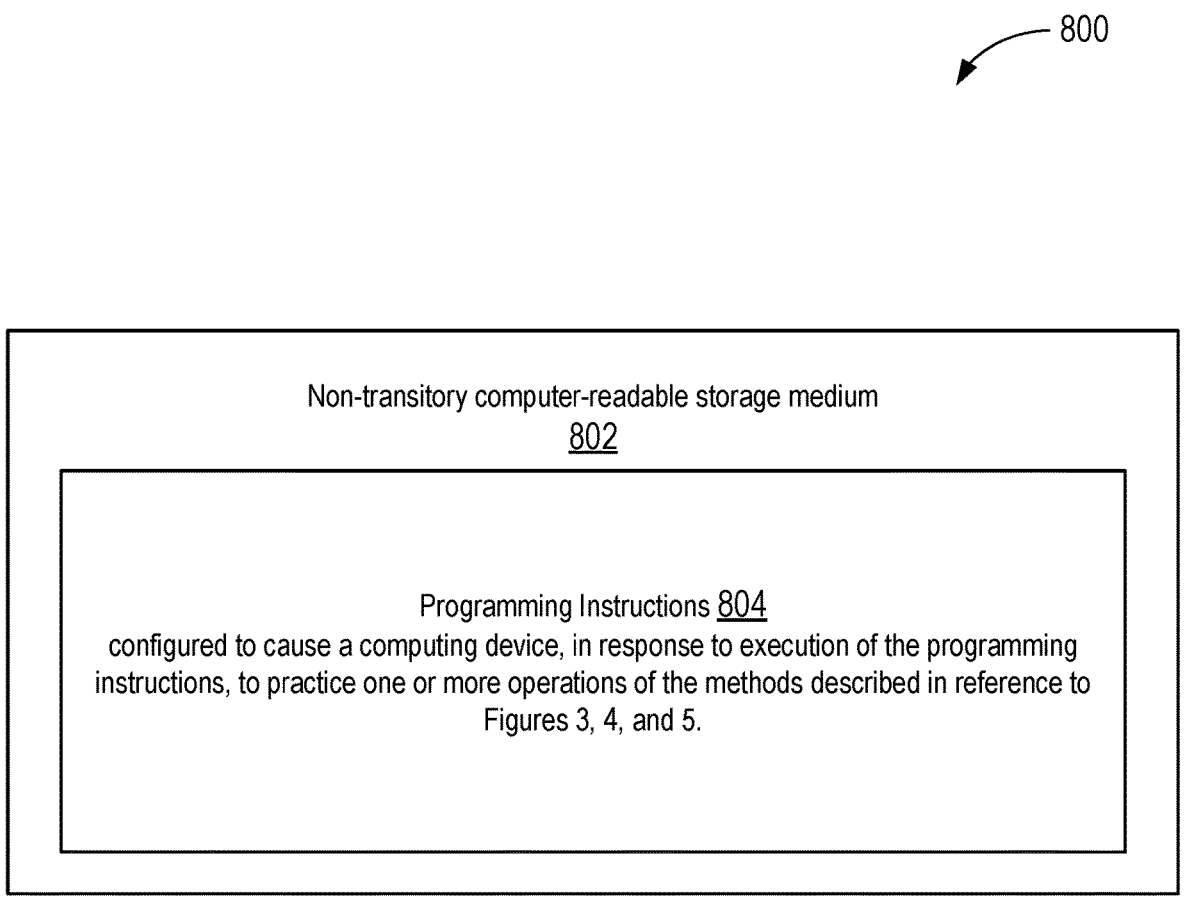
FIG. 8 illustrates an example storage medium with instructions configured to practice the present disclosure, in accordance with various embodiments.

Furthermore, the present disclosure may take the form of a computer program product embodied in any tangible or non-transitory medium of expression having computer-usable program code embodied in the medium. FIG. 8 illustrates an example computer-readable non-transitory storage medium that may be suitable for use to store instructions that cause an apparatus, in response to execution of the instructions by the apparatus, to practice selected aspects of the present disclosure. As shown, non-transitory computer-readable storage medium 802 may include a number of programming instructions 804. Programming instructions 804 may be configured to enable a device, e.g., host device or a memory controller, in response to execution of the programming instructions to perform, e.g., various operations as discussed in FIGS. 3-5.

For example, programming instructions 804 may include one or more non-transitory computer-readable media (CRM) including instructions that cause a host device, in response to the execution of the instructions, to submit a request for a first temperature of a first individual die of a memory device and a second temperature of a second individual die of the memory device. The instructions may cause the host device to receive the first temperature and the second temperature, in response to the request and based at least in part on the temperature of the first individual die, restrict access to the first individual die, and based in part on the temperature of the second individual die, permit access to the second individual die. In embodiments, the instructions to cause the host device to receive the temperature of the individual die include instructions to cause the host device to receive the temperature of the individual die in a completion queue from firmware of a memory controller of the memory device.

In embodiments, the instructions to cause the host device to submit the request for the first temperature and the second temperature include instructions to submit a command to a memory controller via an input/output (I/O) submission queue including read, write and reset commands directed to the respective first individual die and second individual die. Furthermore, in embodiments, instructions to cause the host device to restrict access to the first individual die while permitting access to the second individual die include instructions to respectively stall commands directed to the first individual die while allowing execution of commands directed to the second individual die. In embodiments, the instructions to cause the host device to receive the first temperature and the second temperatures of the first and second respective individual die include instructions to cause the host device to receive the temperature of the individual die in a completion queue from firmware of a memory controller of the memory device.

In alternate embodiments, programming instructions 804 may be disposed on multiple computer-readable non-transitory storage media 802 instead. In alternate embodiments, programming instructions 804 may be disposed on computer-readable transitory storage media 802, such as signals. Any combination of one or more computer-usable or computer-readable medium(s) may be utilized. The computer-usable or computer-readable medium may be, for example, but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer-usable program code may be transmitted using any appropriate medium, including but not limited to wireless, wireline, optical fiber cable, radiofrequency (RF), etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means that implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

According to various embodiments, the present disclosure describes a number of examples.

Example 1 is an apparatus, comprising: a processor to couple to a memory device, wherein the memory device includes an individual die included in a plurality of individual die on the memory device; and a temperature manager operatively coupled to the processor to: submit a request for a temperature of the individual die; and based at least in part on a response to the request that includes the received temperature of the individual die, control access to the individual die by selectively restricting access to the individual die while permitting access to another individual die of the plurality of individual die on the memory device.

Example 2 is the apparatus of Example 1, wherein the temperature manager is to submit the request via an input/output (I/O) submission queue.

Example 3 is the apparatus of Example 1, wherein the memory device includes a physically addressable solid state memory device and the request by the temperature manager for the temperature of the individual die includes a physical address of the individual die.

Example 4 is the apparatus of Example 3, wherein to control access to the individual die of the memory device comprises to selectively throttle or stall commands directed to the individual die.

Example 5 is the apparatus of Example 4, wherein the physically addressable solid state memory device comprises an open-channel solid state memory device and the individual die is included in a first parallel unit (PU) of the open-channel solid state memory device.

Example 6 is the apparatus of Example 5, wherein the individual die shares a transfer bus in the open-channel solid state memory device with another individual die included in a second parallel unit (PU) of the open-channel solid state memory device.

Example 7 is the apparatus of Example 6, wherein to control access by the temperature manager to the individual die in the first parallel unit (PU) comprises to control access independently of controlling access to the another individual die in the second parallel unit (PU).

Example 8 is one or more non-transitory computer-readable media (CRM) comprising instructions that cause a host device, in response to execution of the instructions, to: submit a request for a first temperature of a first individual die of a memory device and a second temperature of a second individual die of the memory device; receive the first temperature and the second temperature, in response to the request; based at least in part on the first temperature of the first individual die, restrict access to the first individual die; and based in part on the second temperature of the second individual die, permit access to the second individual die.

Example 9 is the one or more CRM of Example 8, wherein the instructions to cause the host device to restrict access to the first individual die while permitting access to the second individual die include instructions to respectively stall commands directed to the first individual die while allowing execution of commands directed to the second individual die.

Example 10 is the one or more CRM of Example 8, wherein the instructions to cause the host device to submit the request for the first temperature and the second temperature include instructions to submit a command to a memory controller via an input/output (I/O) submission queue including read, write and reset commands directed to the respective first individual die and second individual die.

Example 11 is the one or more CRM of any one of Examples 8-10, wherein the instructions to cause the host device to receive the first temperature and the second temperature in response to the request, include instructions to cause the host device to receive the first temperature and the second temperature in a completion queue from firmware of a memory controller of the memory device.

Example 12 is a system comprising: a memory controller; a memory device including a plurality of individual die; a host processor coupled to the memory device and the memory controller; and a temperature manager operatively coupled to the host processor to: submit a request to the memory controller for a temperature of an individual die included in the plurality of individual die included on the memory device; and based at least in part on a response to the request that includes the received temperature of the individual die, control access to the individual die by selectively restricting access to the individual die while permitting access to another individual die of the plurality of individual die on the memory device.

Example 13 is the system of Example 12, wherein the memory controller includes a temperature data transfer module operable by the memory controller to receive the request for the temperature of the individual die, wherein the request includes a physical address of the individual die.

Example 14 is the system of Example 13, wherein the memory device comprises an open-channel physically addressable solid state memory drive and the temperature data transfer module comprises firmware to receive the request for the temperature via an input/output (I/O) submission queue from the host processor including I/O commands directed to the individual die.

Example 15 is the system of Example 14, wherein the temperature data transfer module is to decode the physical address and locate the individual die on a shared channel of the memory device and wherein the shared channel is shared by the another individual die in the plurality of individual die on the memory device.

Example 16 is the system of Example 14, wherein the temperature data transfer module is to provide an obtained temperature of the individual die in response to the request via a completion queue entry submitted to the host processor.

Example 17 is the system of Example 16, wherein to provide the obtained temperature of the individual die by the temperature data transfer module further comprises to convert the die temperature received from an individual temperature sensor of the individual die from Celsius to Kelvin.

Example 18 is the system of Example 12, wherein the memory device comprises an open-channel physically addressable solid state memory drive and the memory controller is a non-volatile memory express (NVM Express) controller.

Example 19 is the system of Example 18, wherein the open-channel physically addressable solid state memory device comprises a NAND flash memory or a 3D XPOINT™ solid state memory device.

Example 20 is the system of Example 12, further comprising a host device to include the host processor, wherein the host device includes a server, a desktop, a laptop, or other mobile computing device.

Example 21 is the system of Example 12, wherein the memory device including the individual die corresponds to a logical unit number (LUN) included in a parallel unit (PU) of the memory device.

Example 22 is a method, comprising submitting a request for a temperature of an individual die of the memory device; and based at least in part on a response to the request that includes the received temperature of the individual die, controlling access to the individual die by selectively restricting access to the individual die while permitting access to another individual die on the memory device.

Example 23 is the method of Example 22, wherein to controlling access to the individual die of the memory device comprises to selectively throttle or stall commands directed to the individual die.

Example 24 includes an apparatus comprising means for performing the method of any one of Examples 22 and 23, or some other example herein.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to specific implementations disclosed in the specification and the claims. Rather, the scope is to be determined entirely by the following claims, which are to be construed in accordance with established doctrines of claim interpretation.

What is claimed is:

1. An apparatus, comprising:
a processor to couple to a memory device, wherein the memory device includes an individual die included in a plurality of individual die on the memory device; and
a temperature manager operatively coupled to the processor to:
submit a request for a temperature of the individual die; and
based at least in part on a response to the request that includes the received temperature of the individual die, control access to the individual die by selectively restricting access to the individual die while permitting access to another individual die of the plurality of individual dies on the memory device and wherein the memory device includes a physically addressable solid state memory device and the request for the temperature of the individual die includes a physical address of the individual die.

2. The apparatus of claim 1, wherein the temperature manager is to submit the request via an input/output (I/O) submission queue.

3. The apparatus of claim 1, wherein to control access to the individual die of the memory device comprises to selectively throttle or stall commands directed to the individual die.

4. The apparatus of claim 3, wherein the physically addressable solid state memory device comprises an open-channel solid state memory device and the individual die is included in a first parallel unit (PU) of the open-channel solid state memory device.

5. The apparatus of claim 4, wherein the individual die shares a transfer bus in the open-channel solid state memory device with another individual die included in a second parallel unit (PU) of the open-channel solid state memory device.

6. The apparatus of claim 5, wherein to control access by the temperature manager to the individual die in the first parallel unit (PU) comprises to control access independently of controlling access to the another individual die in the second parallel unit (PU).

7. One or more non-transitory computer-readable media (CRM) comprising instructions that cause a host device, in response to execution of the instructions, to:
submit a request for a first temperature of a first individual die of a memory device and a second temperature of a second individual die of the memory device, wherein the memory device includes a physically addressable solid state memory device and the request for the temperature of the first individual die and the request for the temperature of the second individual die include respective physical addresses of the first individual die and the second individual die;
receive the first temperature and the second temperature, in response to the requests;
based at least in part on the first temperature of the first individual die, restrict access to the first individual die; and
based in part on the second temperature of the second individual die, permit access to the second individual die.

8. The one or more CRM of claim 7, wherein the instructions to cause the host device to restrict access to the first individual die while permitting access to the second individual die include instructions to respectively stall commands directed to the first individual die while allowing execution of commands directed to the second individual die.

9. The one or more CRM of claim 7, wherein the instructions to cause the host device to submit the request for the first temperature and the second temperature include instructions to submit a command to a memory controller via an input/output (I/O) submission queue including read, write and reset commands directed to the respective first individual die and second individual die.

10. The one or more CRM of claim 7, wherein the instructions to cause the host device to receive the first temperature and the second temperature in response to the request include instructions to cause the host device to receive the first temperature and the second temperature in a completion queue from firmware of a memory controller of the memory device.

11. A system, comprising:
a memory controller;
a memory device including a plurality of individual dies;
a host processor coupled to the memory device and the memory controller; and
a temperature manager operatively coupled to the host processor to:
submit a request to the memory controller for a temperature of an individual die included in the plurality of individual dies included on the memory device; and
based at least in part on a response to the request that includes the received temperature of the individual die, control access to the individual die by selectively restricting access to the individual die while permitting access to another individual die of the plurality of individual die on the memory device, wherein the memory device includes a physically addressable solid state memory device and the request for the temperature of the individual die includes a physical address of the individual die.

12. The system of claim 11, wherein the memory controller includes a temperature data transfer module operable by the memory controller to receive the request for the temperature of the individual die.

13. The system of claim 12, wherein the memory device comprises an open-channel physically addressable solid state memory drive and the temperature data transfer module comprises firmware to receive the request for the temperature via an input/output (I/O) submission queue from the host processor including I/O commands directed to the individual die.

14. The system of claim 13, wherein the temperature data transfer module is to decode the physical address and locate the individual die on a shared channel of the memory device and wherein the shared channel is shared by the another individual die in the plurality of individual dies on the memory device.

15. The system of claim 13, wherein the temperature data transfer module is to provide an obtained temperature of the individual die in response to the request via a completion queue entry submitted to the host processor.

16. The system of claim 15, wherein to provide the obtained temperature of the individual die by the temperature data transfer module further comprises to convert the die temperature received from an individual temperature sensor of the individual die from Celsius to Kelvin.

17. The system of claim 11, wherein the memory device comprises an open-channel physically addressable solid state memory device and the memory controller is a non-volatile memory express (NVM Express) controller.

18. The system of claim 17, wherein the open-channel physically addressable solid state memory device comprises a NAND flash memory or a solid state cross-point array memory device.

19. The system of claim 11, further comprising a host device to include the host processor, wherein the host device includes a server, a desktop, a laptop, or other mobile computing device.

\* \* \* \* \*